(12) United States Patent
Ohashi et al.

(10) Patent No.: US 8,897,906 B2
(45) Date of Patent: Nov. 25, 2014

(54) WAFER PROCESSING BASED ON SENSOR DETECTION AND SYSTEM LEARNING

(75) Inventors: Tomohiro Ohashi, Shunan (JP); Akitaka Makino, Hikari (JP); Hiroho Kitada, Kudamatsu (JP); Hideki Kihara, Kudamatsu (JP)

(73) Assignee: Hitachi High-Technologies Corporation, Tokyo (JP)

( * ) Notice: Subject to any disclaimer, the term of this patent is extended or adjusted under 35 U.S.C. 154(b) by 474 days.

(21) Appl. No.: 13/236,818

(22) Filed: Sep. 20, 2011

(65) Prior Publication Data

US 2013/0053997 A1 Feb. 28, 2013

(30) Foreign Application Priority Data

Aug. 23, 2011 (JP) .................................. 2011-181113

(51) Int. Cl.
 H01L 21/68 (2006.01)
 H01L 21/677 (2006.01)
(52) U.S. Cl.
 CPC .......... *H01L 21/68* (2013.01); *H01L 21/67742* (2013.01); *Y10S 901/03* (2013.01); *Y10S 901/46* (2013.01)
 USPC ........... 700/103; 700/112; 700/114; 700/121; 901/3; 901/46
(58) Field of Classification Search
 USPC .............................. 700/112; 901/3, 46; 438/5
 See application file for complete search history.

(56) References Cited

U.S. PATENT DOCUMENTS

| | | | | |
|---|---|---|---|---|
| 4,951,601 A | * | 8/1990 | Maydan et al. | 118/719 |
| 5,268,989 A | * | 12/1993 | Moslehi et al. | 392/418 |
| 5,292,393 A | * | 3/1994 | Maydan et al. | 156/345.32 |
| 5,308,431 A | * | 5/1994 | Maher et al. | 156/345.32 |
| 5,344,542 A | * | 9/1994 | Maher et al. | 204/298.15 |
| 5,556,147 A | * | 9/1996 | Somekh et al. | 294/185 |
| 5,882,165 A | * | 3/1999 | Maydan et al. | 414/217 |
| 6,024,393 A | * | 2/2000 | Shamlou et al. | 414/749.3 |
| 6,103,055 A | * | 8/2000 | Maher et al. | 156/345.32 |
| 6,199,927 B1 | * | 3/2001 | Shamlou et al. | 294/185 |
| 6,214,119 B1 | * | 4/2001 | Maher et al. | 118/719 |
| 6,215,896 B1 | * | 4/2001 | Greig et al. | 382/149 |
| 6,591,161 B2 | * | 7/2003 | Yoo et al. | 700/218 |
| 6,763,281 B2 | * | 7/2004 | Schauer et al. | 700/218 |

(Continued)

FOREIGN PATENT DOCUMENTS

| | | |
|---|---|---|
| JP | 2007-123556 | 5/2007 |
| JP | 2007-149960 | 6/2007 |

*Primary Examiner* — Mohammad Ali
*Assistant Examiner* — Kelvin Booker
(74) *Attorney, Agent, or Firm* — Antonelli, Terry, Stout & Kraus, LLP.

(57) ABSTRACT

A vacuum processing apparatus includes a robot connected to a vacuum container to carry a wafer on one of its two arms to or from a processing chamber; a unit to detect an amount of deviation of the wafer from a predetermined wafer mounting position on the arm that may occur when the robot carries the wafer into or out of the processing chamber; and an adjusting device to adjust the operation of the robot based on the detected amount of deviation. The adjusting device adjusts the robot operation based on the result of a teaching operation performed in advance. After being subjected to the initial teaching operation, the robot again undergoes a second teaching operation according to the information on the amount of wafer position deviation that is detected by moving the wafer in a predetermined transfer pattern, before the wafer processing is performed.

8 Claims, 3 Drawing Sheets

(56) References Cited

U.S. PATENT DOCUMENTS

| | | | |
|---|---|---|---|
| 6,778,874 B2* | 8/2004 | Schauer | 700/112 |
| 6,856,863 B1* | 2/2005 | Sundar | 700/254 |
| 6,925,356 B2* | 8/2005 | Schauer et al. | 700/213 |
| 6,938,505 B2* | 9/2005 | Chen et al. | 73/865.9 |
| 7,033,444 B1* | 4/2006 | Komino et al. | 118/725 |
| 7,079,237 B2* | 7/2006 | Woo et al. | 356/237.2 |
| 7,142,940 B2* | 11/2006 | Ma et al. | 700/121 |
| 7,158,857 B2* | 1/2007 | Schauer et al. | 700/218 |
| 7,266,418 B2* | 9/2007 | Nakayama et al. | 700/115 |
| 7,353,076 B2* | 4/2008 | Nagayasu et al. | 700/112 |
| 7,406,360 B2* | 7/2008 | Machiyama | 700/112 |
| 7,819,033 B2* | 10/2010 | Renken | 73/866.1 |
| 7,959,395 B2* | 6/2011 | Hofmeister et al. | 414/217 |
| 7,963,736 B2* | 6/2011 | Takizawa et al. | 414/217 |
| 8,025,475 B2* | 9/2011 | Wakabayashi | 414/744.5 |
| 8,033,190 B2* | 10/2011 | Renken et al. | 73/866.1 |
| 8,060,252 B2* | 11/2011 | Gage et al. | 700/248 |
| 8,197,177 B2* | 6/2012 | van der Meulen et al. | 414/805 |
| 8,267,632 B2* | 9/2012 | van der Meulen et al. | 414/217 |
| 8,295,968 B2* | 10/2012 | Okuno | 700/121 |
| 8,313,277 B2* | 11/2012 | van der Meulen et al. | 414/217 |
| 8,434,989 B2* | 5/2013 | van der Meulen | 414/217 |
| 8,497,476 B2* | 7/2013 | Hatakeyama et al. | 250/310 |
| 8,500,388 B2* | 8/2013 | van der Meulen et al. | 414/805 |
| 8,602,716 B2* | 12/2013 | van der Meulen et al. | 414/805 |
| 8,651,789 B2* | 2/2014 | Hofmeister et al. | 414/217 |
| 8,672,605 B2* | 3/2014 | van der Meulen et al. | 414/805 |
| 8,696,298 B2* | 4/2014 | van der Meulen et al. | 414/805 |
| 2002/0021959 A1* | 2/2002 | Schauer et al. | 414/744.2 |
| 2002/0057831 A1* | 5/2002 | Hiroi et al. | 382/149 |
| 2003/0060922 A1* | 3/2003 | Schauer et al. | 700/213 |
| 2003/0083776 A1* | 5/2003 | Schauer et al. | 700/218 |
| 2003/0130761 A1* | 7/2003 | Schauer | 700/213 |
| 2004/0031338 A1* | 2/2004 | Chen et al. | 73/865.9 |
| 2004/0095575 A1* | 5/2004 | Woo et al. | 356/300 |
| 2005/0203664 A1* | 9/2005 | Schauer et al. | 700/213 |
| 2006/0155412 A1* | 7/2006 | Ikeda | 700/112 |
| 2006/0206228 A1* | 9/2006 | Ma et al. | 700/121 |
| 2006/0285945 A1* | 12/2006 | Hofmeister et al. | 414/217 |
| 2007/0085005 A1* | 4/2007 | Hasegawa et al. | 250/310 |
| 2007/0100488 A1* | 5/2007 | Nagayasu et al. | 700/112 |
| 2007/0124118 A1* | 5/2007 | Yadav et al. | 702/190 |
| 2007/0134821 A1* | 6/2007 | Thakur et al. | 438/5 |
| 2007/0183871 A1* | 8/2007 | Hofmeister et al. | 414/332 |
| 2007/0269297 A1* | 11/2007 | Meulen et al. | 414/222.01 |
| 2007/0276533 A1* | 11/2007 | Machiyama | 700/121 |
| 2008/0131237 A1* | 6/2008 | van der Meulen | 414/217 |
| 2008/0131238 A1* | 6/2008 | van der Meulen | 414/221 |
| 2008/0145957 A1* | 6/2008 | Lee et al. | 438/5 |
| 2008/0187417 A1* | 8/2008 | van der Meulen et al. | 414/222.02 |
| 2008/0187418 A1* | 8/2008 | van der Meulen et al. | 414/222.02 |
| 2008/0226429 A1* | 9/2008 | van der Meulen | 414/217 |
| 2008/0232933 A1* | 9/2008 | Kiley | 414/217 |
| 2008/0232947 A1* | 9/2008 | van der Meulen et al. | 414/805 |
| 2008/0232948 A1* | 9/2008 | van der Meulen et al. | 414/805 |
| 2009/0053023 A1* | 2/2009 | Wakabayashi | 414/222.13 |
| 2009/0078562 A1* | 3/2009 | Johnson et al. | 204/192.1 |
| 2009/0118862 A1* | 5/2009 | Genetti et al. | 700/254 |
| 2009/0319216 A1* | 12/2009 | Ogata | 702/94 |
| 2010/0158644 A1* | 6/2010 | Takizawa et al. | 414/222.02 |
| 2011/0218662 A1* | 9/2011 | Nakata et al. | 700/112 |
| 2011/0232844 A1* | 9/2011 | Hofmeister et al. | 156/345.31 |
| 2012/0014769 A1* | 1/2012 | van der Meulen | 414/217 |
| 2013/0018501 A1* | 1/2013 | Okuno | 700/112 |
| 2013/0121792 A1* | 5/2013 | van der Meulen et al. | 414/217 |
| 2014/0161570 A1* | 6/2014 | Hofmeister et al. | 414/217 |

* cited by examiner

WAFER PROCESSING BASED ON SENSOR DETECTION AND SYSTEM LEARNING

BACKGROUND OF THE INVENTION

The present invention relates to a vacuum processing apparatus or a vacuum processing method which processes a substrate specimen, such as a semiconductor wafer, by transferring the wafer from inside a depressurized transfer container onto a specimen holder installed in a processing chamber in a vacuum container and producing a plasma in the processing chamber to process the wafer. The invention more specifically relates to a vacuum processing apparatus or a vacuum processing method capable of preventing anomalies that may otherwise occur during the specimen processing operation.

In a process of fabricating semiconductor devices, it is desired that the amount of dust produced or abnormal conditions be kept to a minimum during the transfer of a substrate specimen such as a semiconductor wafer. If dust is produced during the transfer operation before the specimen can be processed in the processing chamber, the dust will adhere to the specimen, degrading the fabrication quality of the processed device from an intended level or causing defects in circuit patterns of the manufactured semiconductor device (e.g., short-circuits), which in turn lowers the yield in the semiconductor device fabrication.

In the event of a fault that is recognized as serious during the specimen transfer, it is a general practice to stop the transfer operation and open the processing chamber to an atmosphere for repair or maintenance. After the repair or maintenance, the air evacuation from the processing chamber takes a long period of time, increasing downtime, a time during which the processing is not carried out, which in turn leads to a degraded efficiency in overall processing performed by the processing apparatus.

To cope with these problems, studies are being made on a technique that minimizes occurrence of serious faults by detecting transfer anomalies, such as wafer position deviation during wafer transfer, and making necessary corrections or annunciating the abnormal condition before the fault leads to more serious troubles such as wafer falling down or being dislocated and apparatus failure. JP-A-2007-123556 (corresponding to U.S. Pat. No. 7,353,076), for example, discloses a technique that detects a deviation of a center of the wafer on a hand of a robot arm holding it from a reference position, adjusts the wafer position according to the detected wafer deviation and then places the wafer at a predetermined position in the processing chamber.

Further, JP-A-2007-149960 discloses a technique which, in an electrode for holding a wafer by electrostatic attraction, detects a wafer position deviation following a discharging operation, determines that there is a discharging operation failure when the position deviation is greater than a predetermined value and cleans the electrode to remove reaction products on the electrode surface to prevent a possible transfer fault.

SUMMARY OF THE INVENTION

These conventional techniques, however, have not given enough considerations to the following points where the problems remain unresolved.

That is, these conventional techniques are intended to detect positional deviations of a specimen during its transfer but do not provide thorough examinations as to a technique for preventing position deviations. JP-A-2007-123556 and -207-149960, for example, do not discuss the technique of, in the process of transfer, identifying causes for the position deviations during transfer and minimizing the deviations.

In these conventional techniques, the operation of the specimen transferring robot to process specimens for mass production is performed only after a robot teaching operation is done which links an actual position of the robot or of each of its arms from a reference position or an origin in the apparatus to a signal produced by a sensor in a drive unit that operates the robot. After the teaching operation, the robot control device can calculate an arm's actual position in the apparatus by using the position signal received from the sensor mounted on the robot, eliminating the need to perform the teaching operation for each transfer action.

Even with a construction that allows a position deviation to be detected by a sensor for each transfer operation and the position deviation to be corrected, it is not possible to completely eliminate a possibility that a fault decision may be made during the transfer operation, causing a normal processing to be interrupted and the corresponding maintenance work to be performed. In addition, among a plurality of vacuum processing apparatus with a means for detecting and correcting such position deviations, there are variations in the rate of making a transfer fault decision, so that to reduce the occurrence of faults requires different responses to individual apparatus, which constitutes an obstruction in a way to reducing downtime.

The object of this invention is to provide a vacuum processing apparatus or a vacuum processing method capable of minimizing the amount of position deviation and thereby reducing downtime.

According to one aspect of this invention, the aforementioned objective is achieved by a vacuum processing apparatus includes: a vacuum container having a processing chamber and a specimen holder installed in the processing chamber, the processing chamber having its interior depressurized to process a wafer, an object to be processed, the specimen holder being adapted to hold the wafer on an upper surface thereof by an electrostatic attraction; a robot (installed in a vacuum transfer chamber) connected to the vacuum container to carry the wafer on one of two arms thereof to or from the specimen holder in the processing chamber; a unit to detect an amount of deviation of the wafer from a predetermined wafer mounting position on the arm that may occur when the robot carries the wafer into or out of the processing chamber; and an adjusting device to adjust the operation of the robot based on the detected amount of deviation; wherein the adjusting device adjusts the robot operation based on the result of a teaching operation that relates information from sensors representing detected positions of the arms to actual positions of the arms; wherein, after being subjected to the initial teaching operation, the robot again undergoes a second teaching operation according to the information on the amount of wafer position deviation that is detected by moving the wafer in a predetermined transfer pattern, before the wafer processing is performed.

According to another aspect of this invention, the aforementioned objective is achieved by a vacuum processing method, which involves putting a wafer on one of two arms of a robot installed in a vacuum transfer chamber, transferring the wafer on the arm from the transfer chamber onto a specimen holder in a processing chamber of a vacuum container connected to the transfer chamber, holding the wafer on the specimen holder by electrostatic attraction, producing a plasma in the processing chamber to process the wafer then, after processing the wafer, moving the arm of the robot into the processing chamber to retrieve the wafer from the specimen holder onto the arm, and carrying the wafer from the processing chamber into the transfer chamber; the vacuum processing method includes: a step of preparing a unit and an adjusting device, the unit detecting an amount of deviation of the wafer on the arm in the vacuum transfer chamber from a reference position, the adjusting device adjusting an operation of the robot based on the detected amount of deviation; a step of, after a teaching operation that links information from sensors detecting in advance the position of the arm to an actual position of the arm, performing again the teaching operation according to information on an amount of wafer position deviation detected by transferring an arbitrary wafer in a predetermined transfer pattern; and a step of adjusting the operation of the robot by the adjusting device according to a result of the second teaching and transferring the wafer for processing.

Further, the above objective is achieved by a vacuum processing method which, in the second teaching operation, sets a reference position of one of the two arms in a way that matches the amount of deviation detected during the transfer operation by the one arm with the amount of deviation detected during the transfer operation by the other arm.

Further, the above objective is achieved by a vacuum processing method which, in the second teaching operation, matches an average of the amount of the deviation detected during the transfer operation of one or more of the wafers by the one arm to an average of the deviation amount detected during the transfer operation by the other arm.

Further, the above objective is achieved by a vacuum processing method which, based on the information on the position deviation amounts detected by executing a plurality of wafer transfer patterns using a combination of the two arms, performs the second teaching operation in a way that matches the position deviation amounts detected during some of the plurality of transfer patterns that exceed a predetermined allowable range to the position deviation amounts detected during the other transfer patterns that fall within the predetermined allowable range.

Other objects, features and advantages of the invention will become apparent from the following description of the embodiments of the invention taken in conjunction with the accompanying drawings.

DETAILED DESCRIPTION OF THE EMBODIMENT

One embodiment of this invention will be described in detail by referring to the accompanying drawings.

The embodiment of this invention will be explained by referring to FIG. 1 through FIG. 4.

Figure 1:
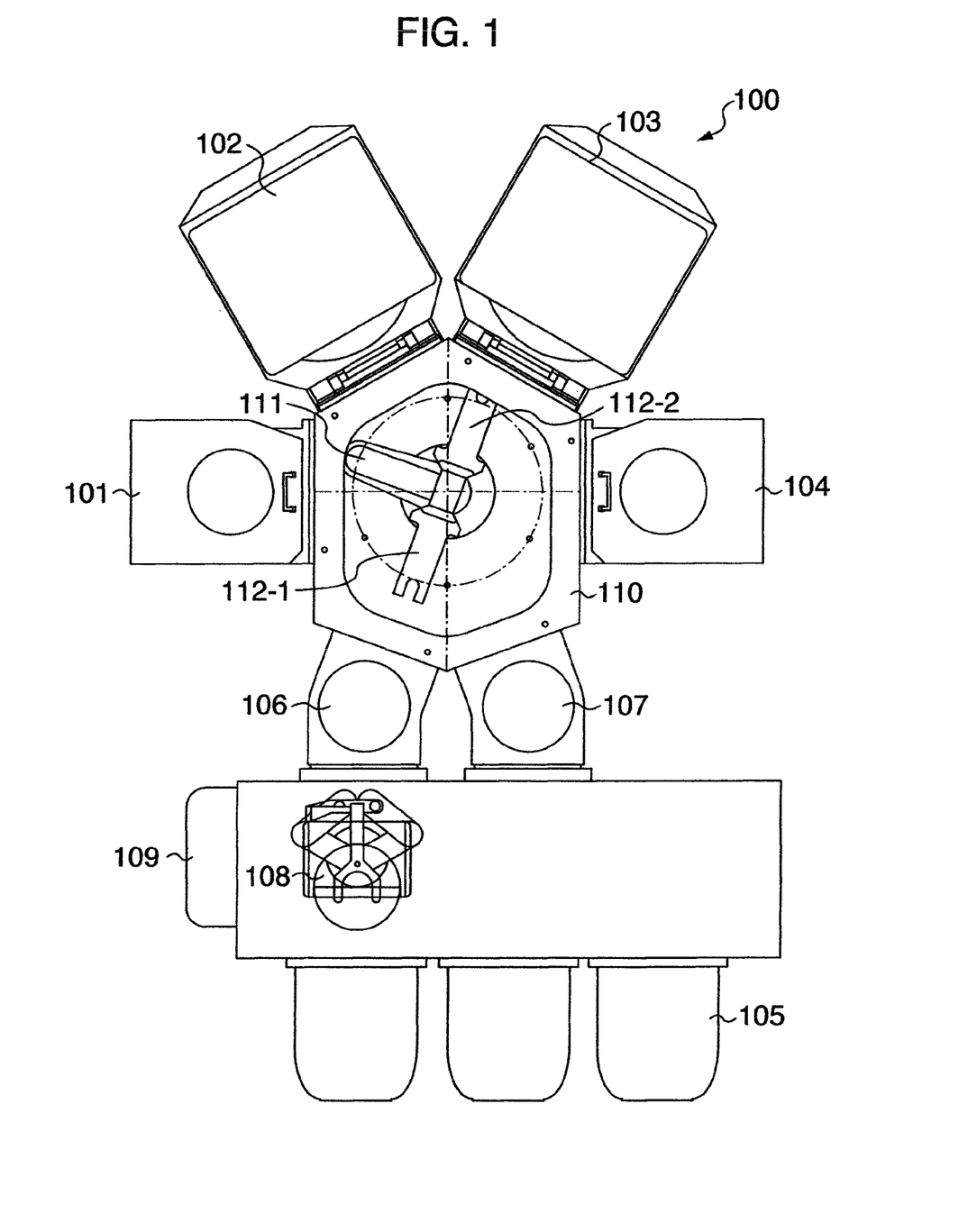
FIG. 1 is a plan view showing an outline construction of a vacuum processing apparatus as one embodiment of this invention.

FIG. 1 shows an overall schematic construction of a vacuum processing apparatus 100 according to one embodiment of this invention. In this figure, the vacuum processing apparatus 100 is designed to transfer a wafer between a plurality (four) of processing chambers 101, 102, 103, 104 and a plurality (three) of cassette placement tables 105. The processing chambers 101, 102, 103, 104 may also be ones in which to execute plasma etching, deposition of layers and/or sputtering.

These processing chambers 101, 102, 103, 104 are each constructed of a vacuum processing container which has, in its inner space depressurized to a predetermined pressure (vacuum pressure), a specimen holder on which a specimen such as a wafer is placed. These containers are supplied with a process gas and at the same time applied an electric field or magnetic field from an electric field or magnetic field supply unit not shown, to form a plasma in a space above the wafer in the processing chamber to treat the surface of the specimen.

A buffer chamber 110 of the vacuum processing apparatus or wafer processing apparatus 100 is constructed of a vacuum container with its inner pressure adjustable to an equivalent of inner pressures of the processing chambers 101. The buffer chamber 110 is connected at its front side (in a vertical direction in the figure) with a plurality of loadlock chambers 106, 107 used to introduce a wafer into a vacuum side. The buffer chamber 110 is used as a transfer chamber in a vacuum transfer container in which is installed a vacuum robot 111 that holds a wafer on its hands 112-1, 112-2 for transfer through a depressurized interior of the chamber.

The processing chambers 101, 102, 103, 104, the buffer chamber 110 and the loadlock chambers 106, 107 together constitute a vacuum side block for transferring and processing specimens under the depressurized condition. The plurality of loadlock chambers 106, 107 are connected to an atmospheric transfer chamber 109 having an atmospheric robot 108 installed therein. The atmospheric transfer chamber 109 has on its front side cassette placement tables 105 on which to put a wafer-accommodating cassette. The loadlock chambers 106, 107 function as an open-close mechanism for inserting and retrieving the wafers and also as a variable pressure interface between the vacuum side block and the atmospheric transfer chamber 109.

The atmospheric robot 108 picks up a wafer from a cassette put on the cassette placement table 105 and moves it into the atmospheric transfer chamber 109 where it performs centering of the wafer and direction alignment of a notch center before loading it into the loadlock chamber 106 or 107.

The wafer loaded into the loadlock chamber 106 or 107 is placed on a specimen holder installed in the chamber. With the interior of the loadlock chamber depressurized and the wafer raised on a stage in the specimen holder, the hand 112-1 or 112-2 at the end of an arm of the vacuum robot 111 is moved under the wafer which is then transferred onto the hand. Then, the arm of the vacuum robot 111 retracts to carry the wafer on the hand 112-1 or 112-2 into the buffer chamber 110.

In the buffer chamber 110, the vacuum robot 111 rotates to change its direction toward the processing chambers 101, 102, 103, 104 and extends its arm to insert the wafer into these processing chambers where it is subjected to processing such as plasma etching, layer deposition and/or sputtering. This series of processing is performed in the hermetically sealed processing chambers 101, 102, 103, 104.

For example, the wafer inserted into the processing chamber 101 is put on the specimen holder not shown. As in the interior of the loadlock chamber 106 or 107, the processing chamber 101 has a plurality of pusher pins in the specimen holder that move up or down to raise or lower the wafer.

With these pusher pins moved up to the raised position, the arm of the vacuum robot 111 situated above the pusher pins is lowered, transferring the wafer resting on the hand at the front end of the arm onto the pusher pins, i.e., onto the specimen holder, after which the arm is moved into the buffer chamber 110. Then, the pusher pins are lowered and retracted into the specimen holder so that the wafer is lowered onto an upper surface of the specimen holder, a wafer supporting surface coated with a dielectric film.

Then, a process gas is introduced into the processing chamber 101 which at the same time is evacuated by a vacuum pump not shown until its interior is adjusted to a predetermined pressure (vacuum pressure). A wafer attracting electrode arranged inside the dielectric film is applied electricity to generate an electrostatic attraction force between the wafer and the dielectric film, causing the wafer on the specimen holder to be held to the wafer supporting surface.

Between the wafer supporting surface and the back of the wafer there is introduced a heat conducting gas, such as He, to transfer heat between the wafer and the specimen holder to adjust the temperature of the wafer surface to within a desired range. In this state, an electric field or magnetic field is applied to a space over the wafer in the processing chamber 101 to transform the process gas into a plasma, with which the wafer surface is processed.

After this processing is finished, the wafer attracting electrode is deenergized to reduce the electrostatic attraction force. Then the pusher pins are raised to lift the wafer from the wafer supporting surface. A gate valve hermetically sealing the processing chamber 101 is opened, after which the vacuum robot 111 extends its arm to insert the hand at the front end of the arm under the wafer. As the pusher pins are moved down, the wafer is lowered onto the holding surface of the hand of the arm. The pusher pins are again retracted into the specimen holder.

After being processed in the processing chambers 101, 102, 103, 104, the wafer is transferred to the vacuum robot 111 as described above. The wafter is then moved between the processing chambers or between the processing chambers and the loadlock chambers through a combination of the retracting action of the arm of the vacuum robot 111, the rotation of the vacuum robot 111 and the extending action of the arm.

The operation of the vacuum robot 111 or the atmospheric robot 108 is regulated by dedicated controllers not shown. These dedicated controllers may be connected to a higher-level controller that controls the overall operation of the vacuum processing apparatus 100 so that control signals can be transferred between them or constructed integral with the higher-level controller.

During the wafer transfer or transport by the vacuum robot 111, the wafer put on the controlled vacuum robot 111 or on its arm may be held at a position deviated from an intended one. So, it may not be possible to precisely position and place the wafer at a target destination position.

That is, during wafer transfer problems may occur, such as a position deviation occurring between the wafer and the predetermined position on the arm or on the hand at the end of the arm, and the wafer inadvertently shifting its position on the arm or hand. For example, consider a case where the wafer is lifted by the pusher pins and the arm of the vacuum robot 111 is controlled to move its hand to the intended position under the wafer. If the position at which the wafer is raised by the pusher pins differs from a reference position where the wafer is supposed to be placed on the arm or the hand, the deviation mentioned above will result. This problem is likely to occur when the electrostatic attraction force remaining during the lifting of the wafer is more than a predetermined magnitude or when there is unevenness in the arrangement, shape and positions of the pusher pins. Further, the deviation from the wafer transfer reference position will also occur when the wafer on the wafer supporting surface is shifted from its intended position.

When there are such wafer position deviations, the positioning of the wafer on the wafer supporting surface of the specimen holder in the processing chamber becomes unstable, causing the wafer attracting force to be uneven over the wafer supporting surface and rendering the wafer processing ununiform, which in turn results in a reduced processing yield. The wafer position deviations also raise other problems, such as the wafer being unable to be placed on the arm or hand stably during the wafer transfer so that it may fall while being transported or that it may come into contact with inner surfaces of the apparatus, causing faults or contamination. It is therefore being called for that the wafer be able to be placed on the upper surface of the arm or hand or transferred to a target position on the wafer supporting surface on the specimen holder with high precision.

Still another problem is that the operation of the vacuum robot 111 during the wafer transfer may result in the wafer changing its position on the upper surface of the arm. A conceivable solution to this problem may be to arrange pins on the arm according to the shape and diameter of the wafer so that they come into contact with the wafer edge to hold it in its place. In this case, however, the arm position needs to be controlled with high precision to bring the plurality of pins into contact with the circumferential edge of the wafer for its firm support. Without a high-precision arm control, a proper support cannot be provided and the wafer may fall or become tilted while being transported. This will increase the chance of the wafer failing to be placed correctly at the destination position, degrading the process efficiency. This problem may also increase the cost of the vacuum robot 111, raising the overall production cost of the apparatus. Furthermore, the contact between the pins and the circumferential edge of the wafer may produce dust, which in turn contaminate the wafer and the interior of the apparatus, such as the processing chamber, lowering the processing yield, increasing the frequency of cleaning operation and degrading the processing efficiency.

For the reasons described above, this embodiment employs a technique of supporting the back of the wafer with a surface or a plurality of points on the hand at the end of the arm and at the same time holding the wafer with a gap formed along the circumferential edge.

With the construction of this embodiment, the wafer may, while being transported, get dislocated from its correct position by the vacuum robot 111 as it moves and stops. It is therefore necessary to detect a position shift of the wafer and adjust the transporting and processing operations of the vacuum processing apparatus according to the detected shift.

Figure 2:
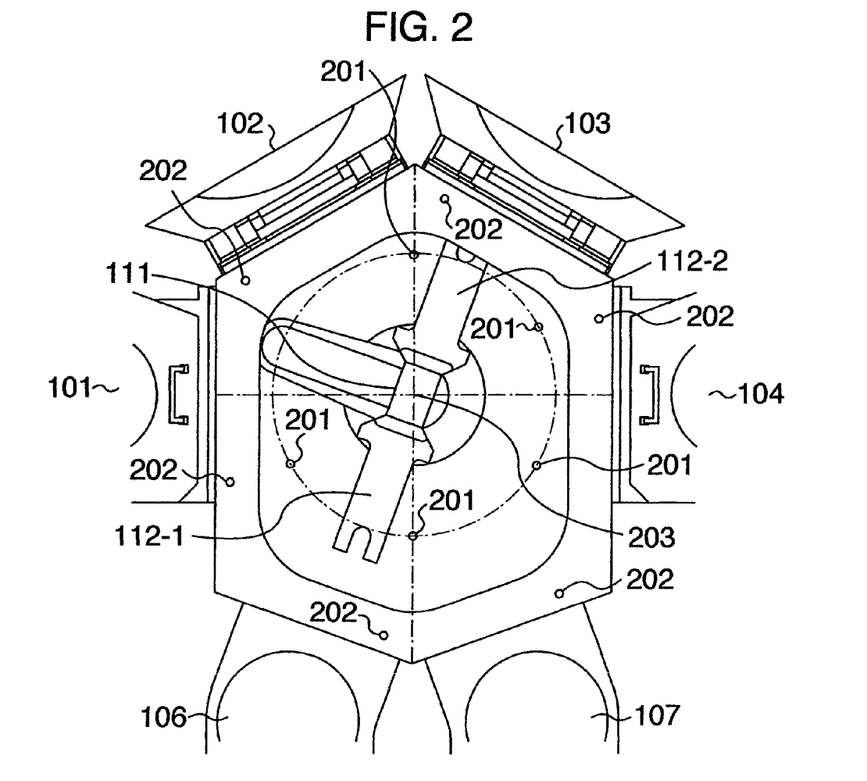
FIG. 2 is an enlarged view showing a position in a buffer chamber at which a sensor is mounted in the embodiment of FIG. 1.

FIG. 2 shows sensor mounting positions in a vacuum transport device 200 (buffer chamber 110) of the vacuum processing apparatus 100. The vacuum transport device 200 is comprised of a vacuum container the side surface of which is connected with a plurality of processing chambers 101, 102, 103, 104 and a plurality of loadlock chambers 106, 107. Through a path communicating with these chambers, the wafer can be transported between the processing chambers and the loadlock chambers.

In this embodiment, the vacuum robot 111 has its center 203 set at around the center of the buffer chamber 110 and can be rotated through a predetermined angle θ about the center 203 as an axis. The rotation of the vacuum robot 111 or its arm about its center 203 is referred to as a θ-axis operation or a θ-axis rotation (rotation about the θ axis).

Further, at a predetermined θ-axis rotation angle position, the vacuum robot 111 can extend or retract its arm in a direction connecting its center 203 and the outer circumferential side of the buffer chamber 110 (processing chamber side) to move the wafer carrying hand 112-1 or 112-2 at the end of the arm back and forth between the interior of the buffer chamber 110 and the interior of the processing chambers. This extension and retraction movement is referred to as an R-axis operation.

In the vacuum transport device 200 (buffer chamber 110) of the vacuum processing apparatus 100, this invention provides θ-axis sensors 201 and R-axis sensors 202 in the operation directions of the vacuum robot 111, θ- and R-axis directions, respectively (six θ-axis sensors 201 and six R-axis sensors 202 are provided where the vacuum processing apparatus 100 has two loadlock chambers and four processing chambers).

A plurality (at least as many as the processing chambers and the loadlock chambers) of θ-axis sensors 201 are arranged on an arc with its radius originating from the center 203 of the vacuum robot 111. Each of the θ-axis sensors 201 is composed of a pair of highly directional optical sensors disposed one above the buffer chamber 110 and the other below it, with one sensor emitting a light and the other detecting the quantity of the emitted light. The presence or the passing of the wafer between the vertically paired sensors is detected when the wafer interrupts the light beam. By arranging such vertically paired sensors at the radial positions where the wafer passes between the paired sensors as the vacuum robot 111 rotates, the distance from the center of the vacuum robot 111 to the center of the wafer can be calculated using outputs of the θ-axis sensors 201 during the rotation of the vacuum robot 111.

The R-axis sensors 202 are arranged on lines extending in the vacuum robot arm extension/retraction direction which connect the individual processing chambers or loadlock chambers and the center 203. Like the θ-axis sensors 201, the R-axis sensors 202 of this embodiment are highly directional optical sensors and detect the presence of the wafer at, or its passage through, the sensor-mounted positions when the wafer interrupts the beam during the wafer-loaded arm extension operation.

Using outputs of the R-axis sensors 202 during the extension/retraction of the arm, the distance from the center of the hand of the vacuum robot 111 to the center of the wafer can be calculated.

The θ-axis sensors 201 and the R-axis sensors 202 are arranged such that, when the hands 112-1, 112-2 are retracted to take the wafers completely out of the processing chambers to retracted or standby positions where the wafers are closest to the rotating center axis of the vacuum robot 111, the wafers are disposed between these paired sensors and therefore not detected. That is, in this embodiment, the θ-axis sensors 201 and the R-axis sensors 202 are intended to detect the wafer passage and its time, not to detect the presence or absence of the wafer.

A wafer displacement is calculated from the outputs of the θ-axis sensors 201 and the R-axis sensors 202. Only when the calculated displacement is equal to or greater than a specified value, is the position correction performed. The method of determining the displacement takes a value used in a teaching step as an absolute value and calculates the displacement by using a difference from the absolute value.

Teaching is done on the atmospheric robot 108 side and also on the vacuum robot 111 side. What is done on the vacuum robot 111 side is the combining together of an angle through which the vacuum robot 111 rotates from an operation start point to each processing chamber and a distance from the retracted position prior to wafer loading to each processing chamber. Before starting the operation for mass production or for a desired lot processing by the vacuum processing apparatus 100, information on a reference position of the vacuum robot 111 and information on a position of the vacuum robot 111 that is detected by a controller of the vacuum robot 111 using sensor signals are related to each other and stored in the controller. With this matchup made, the controller of the vacuum robot 111 can detect the absolute position of the robot 111 in the vacuum processing apparatus 100 by using signals received from the sensors during the operation of the vacuum robot 111. That is, the position of the arm or hand 112-1 or 112-2, i.e., a reference position on which its movement is based, is stored in the vacuum robot 111 or the robot controller that can freely adjust the arm position within an allowable range, by setting the arm's or hand's reference position as position information relative to a particular wafer position on the arm or hand or to a particular position on a destination location in the apparatus, such as a particular position on the specimen holder in the processing chamber 101.

For example, the arm position that puts the wafer, which is placed on a specific position on the arm's hand, a predetermined distance from a specific position on the specimen holder in the processing chamber 101 is set as reference position information. Based on the reference position information, the position of the arm is adjusted by rotating the vacuum robot 111 in the θ-axis direction and extending or retracting the arm in the R-axis direction. These adjustments are made using a jig so that the center of the hand is aligned with the center of each processing chamber.

Figure 3:
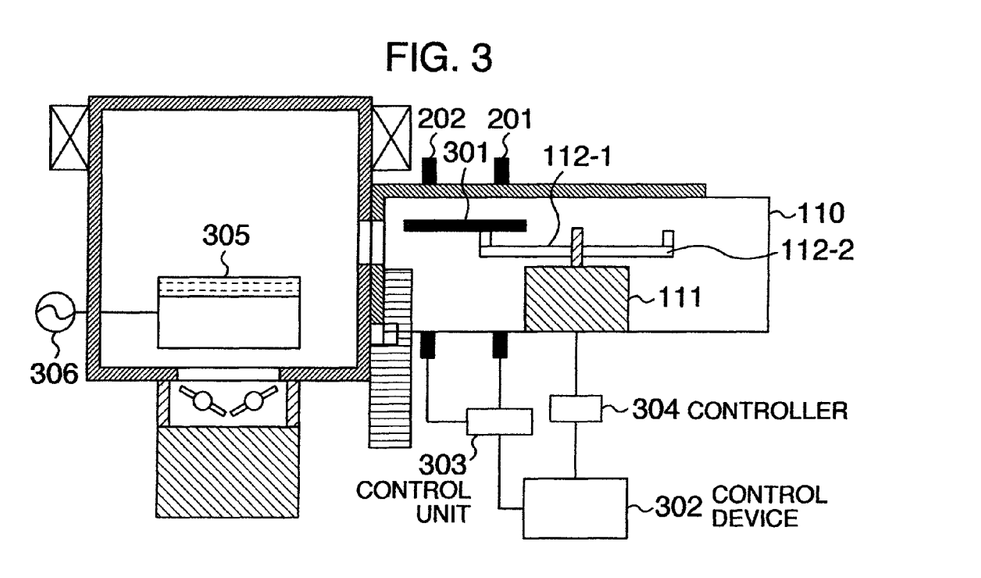
FIG. 3 is a schematic, vertical cross-sectional view showing a construction of a processing chamber and the buffer chamber in the embodiment of FIG. 1.

FIG. 3 is a transverse cross section showing details of the processing chamber and the buffer chamber. A control unit 303 that receives outputs from the θ-axis sensors 201 and the R-axis sensors 202 sends a signal to a control device 302 that performs an overall control on the apparatus. The control device 302 calculates a position shift or deviation from the position taught to the robot, using an arithmetic unit. The information on the position shift is transferred to a controller 304 that controls the vacuum robot 111. Based on the position shift information received, the controller 304 adjusts the arm position.

The specimen holder 305 in the processing chamber is constructed to be able to hold the wafer 301 by electrostatic attraction. When, with the wafer 301 held on the specimen holder 305 by electrostatic attraction, a predetermined etching operation is finished, the electrostatic attraction is canceled (this operation is hereinafter referred to as a "discharging operation") and a plurality of pusher pins of a push-up mechanism (not shown) installed in the specimen holder 305 are driven to raise the wafer 301 from the specimen holder 305. If at this time the electrostatic attraction force of more than a specified magnitude remains, a position shift will result during the transfer of the wafer 301. So, optimal parameters for the discharging operation, such as operation timing of the pusher pins, are set in the specimen holder 305.

Then, the vacuum robot 111 is operated to insert the hand 112-1 or 112-2 under the raised wafer 301. Next, the pusher pins of the push-up mechanism are lowered to transfer the wafer 301 onto the hand 112-1 or 112-2. The pusher pins continue to be moved down until they are retracted into the specimen holder 305. Now, the transfer of the wafer from the pusher pins to the hand 112-1 or 112-2 is complete.

Having received the wafer 301 on its hand 112-1 or 112-2 as described above, the vacuum robot 111 takes it out of the processing chamber into the buffer chamber 110. Then, the wafer 301 is transported to another processing chamber or the loadlock chamber 106 or 107. At this time, the wafer 301 again passes in the θ- and R-axis directions between the vertically paired sensors—the paired θ-axis sensors 201 and the paired R-axis sensors 202—placed at their predetermined positions. As the wafer passes through the paired sensors, the control device 302 receives outputs from these sensors and detects the amount of wafer position deviation that occurred when the wafer 301 was taken out of the processing chamber.

Figure 4:
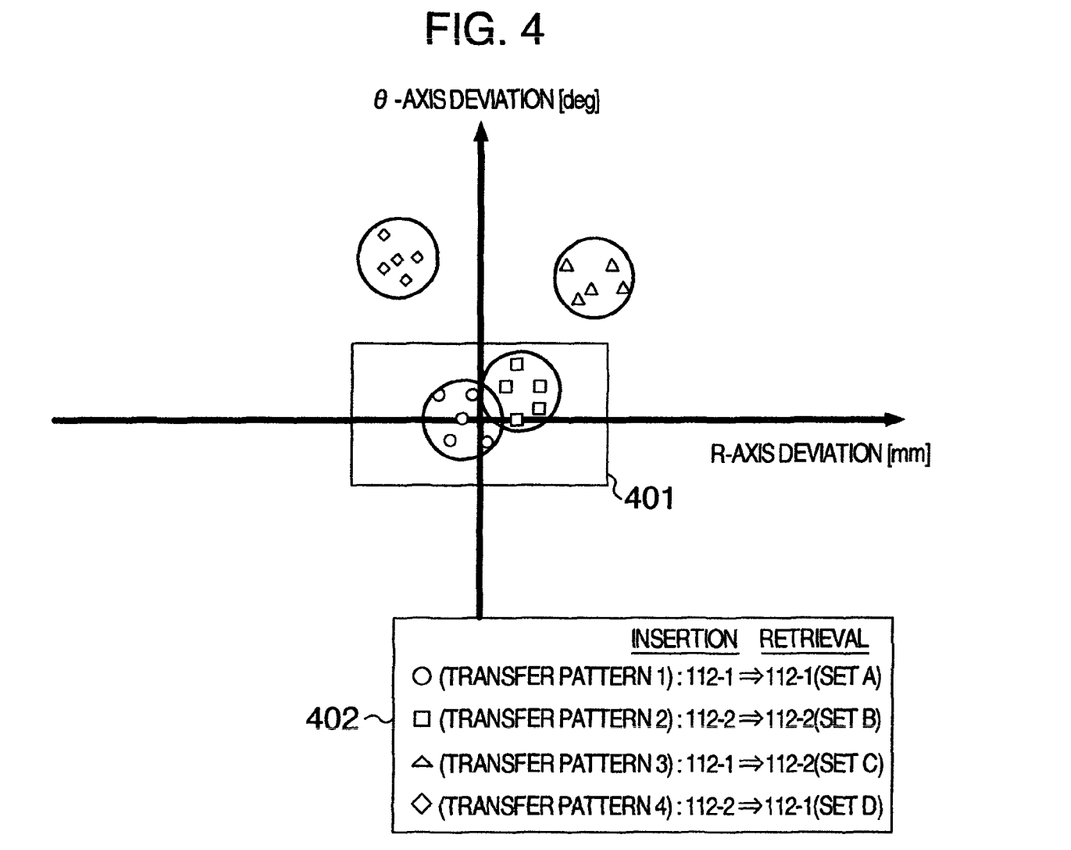
FIG. 4 is a graph showing amounts of deviation, or offset, of wafers from a position taught to a vacuum robot, as detected in the embodiment of the vacuum processing apparatus shown in FIG. 1.

FIG. 4 shows a result of detecting the amount of shift of the wafer 301 as it is carried out of the processing chamber. In this embodiment, when the amount of wafer shift exceeds thresholds preset for the R-axis direction and the θ-axis direction, a position deviation annunciator in the vacuum processing apparatus 100 sounds an alarm.

It is seen from the figure that, in a coordinate plane defined by two axes of different directions, detection sample sets are divided into two groups, one falling in a position deviation allowable range inside an enclosure line 401 representing a threshold and the other falling outside it. Each of the sample sets represents a set of those detection samples whose position deviations are close to a particular value. The threshold of position deviation is determined by such factors as an operation/stop accuracy of the vacuum robot 111 and reading precisions of the θ-axis sensors 201 and the R-axis sensors 202.

As described above, if the specimen holder 305 that holds the wafer by electrostatic attraction has, after the discharging operation, a residual attraction force greater in magnitude than a predetermined value, the wafer 301 may get dislocated as it is raised by the pusher pins accommodated in the specimen holder 305. For electrostatic attraction of the wafer 301, the specimen holder 305 has its wafer-mounting top surface covered with an insulating film of a dielectric material. Inside the insulating film there are a plurality of film-like electrodes that are applied DC power of different polarities. The insulating film is fabricated by adjusting its thickness and area, a specific resistance of the insulating material and others to predetermined values.

Many hours of continuous operation, such as etching, result in reaction products depositing in the etching chamber as the etching proceeds. The reaction products also deposit on the specimen holder 305. As a result, the properties of the electrostatic attraction film, such as surface roughness or specific resistance, change, causing variations in a characteristic distribution in the electrostatic attraction film. As a result, the discharging operation becomes unstable, which in turn shifts the position of the wafer 301 as it is raised by the pusher pins.

To verify the position deviation of the wafer 301 caused by the residual attraction force on the specimen holder 305, the inventors of this invention repetitively conducted predetermined times a test of transferring the wafer 301 by using only the pusher pins in the specimen holder 305 to detect the amount of wafer position deviation for each transfer operation. In the test, the amount of wafer position deviation exceeded the threshold, setting off a position deviation alarm similar to the one described above.

Judging from the fact that the position deviations of the wafer 301 have been detected even when the wafer transfer is done only by activating the pusher pins in the specimen holder 305, the inventors of this invention have assumed that there is a correlation between the position deviation of the wafer carrying hand 112-1 and 112-2 and that of the wafer 301 and studied the position deviation values. Our examination has found that, for each of the hands that carry the wafer, the distribution of position deviations in two directions caused by the wafer transfer operations can be grouped into four sets on a 2-axis coordinate plane. As described earlier, the wafer position deviations are from those positions in the processing chambers 101, 102, 103, 104 and the loadlock chambers 106, 107 that were taught to the robot. We also found that the four sets of position deviations correspond to different patterns of wafer transfer by the hands 112-1, 112-2, that there are errors in the positions that were taught to the hands and that these errors during the hand teaching operation are recognized by the control unit 303 as the wafer position deviations in the respective transfer patterns. Based on these findings, the inventors of this invention have arrived at this invention.

When there are hand teaching errors, they are recognized as wafer position deviations. So, even if there is in reality no anomaly in the wafer transfer operation, the apparatus recognizes the teaching error as a transfer anomaly; or if there actually is a transfer anomaly, the apparatus fails to detect it, leading to a serious fault and stopping the apparatus, which in turn lowers the production yield. This apparatus, therefore, reduces the chances of transfer anomaly by, after the teaching of the vacuum robot 111, detecting a position deviation of the wafer to detect possible hand teaching errors and by teaching the vacuum robot 111, this time, the adjusted hand positions.

In this embodiment, after the initial teaching of the vacuum robot 111, the wafer is transferred once into each of the processing chambers 101, 102, 103, 104 for a predetermined transfer pattern, e.g., for each of the transfer patterns 402 shown in FIG. 4. At this time, the processing is not executed in the processing chambers 101-104, nor is the wafer held on the specimen holder 305 by electrostatic attraction. Then, in each of these processing chambers, wafer position deviations are detected for all of the transfer patterns.

Four transfer patterns 402 are performed in this embodiment: a transfer pattern 1 inserting the wafer into the processing chamber by the hand 112-1 and taking it out by the same hand; a transfer pattern 2 inserting the wafer into the processing chamber by the hand 112-2 and taking it out by the same hand; a transfer pattern 3 inserting the wafer into the processing chamber by one hand 112-1 and taking it out by the other 112-2; and a transfer pattern 4 inserting the wafer into the processing chamber by the second hand 112-2 and taking it out by the first 112-2.

By taking as a reference the coordinate system for the transfer pattern 1 or 2 that uses the same hand in inserting and removing the wafer 301 into or from a processing chamber and which results in the wafer position deviation falling within the allowable range, the control device 302 calculates a difference in the position deviation between this transfer pattern and others. The control device 302 issues to the controller 304, dedicated to controlling the vacuum robot 111, a command signal requesting it to change the position taught to the robot by an amount of the calculated difference. According to the command signal received, the controller 304 corrects the position information previously taught to the vacuum robot 111 so that the reference positions for measuring wafer position deviations in all transfer patterns 402 agree, thus bringing the position deviations in these transfer patterns into the allowable range.

After this, the wafer is transferred again in these patterns to detect the position deviations and a check is made to confirm that the detected position deviations are within the allowable range for all transfer patterns. Then, the processing for mass production or lot processing is initiated by transferring the water in the vacuum processing apparatus 100.

The teaching operation may be done manually according to the information on the coordinate system of the hands 112-1 and 112-2, or by transferring the wafer a predetermined number of times in each of the transfer patterns 402.

Where the wafer is subjected to the etching operation and held on the specimen holder 305 by the electrostatic attraction, the wafer transfer operation is repeated more than 10 times for all transfer patterns and the average value of the coordinate system for each transfer pattern is calculated by the control device 302, which then requests the controller 304 to change the previously taught position by only an amount of difference from the transfer pattern 1 or 2, thereby making distribution variations among the different transfer patterns converge.

In the wafer position deviation detection apparatus of the above embodiment, reference positions taught to the vacuum robot having a plurality of hands are detected by position deviation sensors and the previously taught reference positions are adjusted to minimize the wafer position deviations that may occur during wafer transfer. With this method, a vacuum processing apparatus with high yields can be provided. It should be further understood by those skilled in the art that although the foregoing description has been made of embodiments of the invention, the invention is not limited thereto and various changes and modifications may be made without departing from the spirit of the invention and the scope of the appended claims.

The invention claimed is:

1. A vacuum processing apparatus comprising:
   a vacuum container having a processing chamber and a specimen holder installed in the processing chamber, the processing chamber having its interior depressurized to process a wafer as an object to be processed, the specimen holder being adapted to hold the wafer on an upper surface thereof by an electrostatic attraction;
   a vacuum transfer chamber which is depressurized and connected to the vacuum container, the wafer being transferred to the processing chamber from an interior space of the vacuum transfer chamber or transferred into the interior space of the vacuum transfer chamber from the processing chamber;
   a robot which is installed in the vacuum transfer chamber to transfer the wafer on one of two arms thereof to or from the specimen holder in the processing chamber;
   a unit which detects an amount of deviation of the wafer from a predetermined wafer mounting position on the arm that may occur when the robot transfers the wafer into or out of the processing chamber; and
   an adjusting device which adjusts an operation of the robot based on the detected amount of deviation;
   wherein the adjusting device adjusts the robot operation based on the result of an initial teaching operation that relates information from sensors representing detected positions of the arms to actual positions of the arms, and
   wherein, after being subjected to the initial teaching operation, the robot undergoes a second teaching operation before processing the wafer, in the second teaching operation, an amount of wafer position deviation being detected during a wafer transfer operation in each of predetermined plural patterns which include a first pattern of transferring the wafer into or out of the processing chamber using only one of the arms and a second pattern of transferring the wafer into or out of the processing chamber using the two arms, and the information from the sensors in the initial teaching operation is adjusted such that the amount of wafer position deviations in the first pattern and the second pattern can be matched.

2. A vacuum processing apparatus according to claim 1, wherein, in the second teaching operation, a reference position of one of the two arms is set in a way that matches the amount of deviation detected during the wafer transfer operation in the first pattern to the amount of deviation detected during the wafer transfer operation in the second pattern.

3. A vacuum processing apparatus according to claim 2, wherein, in the second teaching operation, an average of the amounts of deviations detected during the transfer operation of one or more wafers in the first pattern is matched to an average of the amounts of deviations detected during the wafer transfer operation in the second pattern.

4. A vacuum processing apparatus according to claim 1, wherein, based on the information on the position deviation amounts detected by executing a plurality of wafer transfer patterns using a combination of the two arms, the second teaching operation is performed in a way that matches the position deviation amounts detected during some of the plurality of transfer patterns that exceed a predetermined allowable range to the position deviation amounts detected during the other transfer patterns that fall within the predetermined allowable range.

5. A vacuum processing method, which includes steps of putting a wafer on one of two arms of a robot installed in a vacuum transfer chamber, transferring the wafer on the arm from the transfer chamber onto a specimen holder in a processing chamber of a vacuum container connected to the transfer chamber, holding the wafer on the specimen holder by electrostatic attraction, producing a plasma in the processing chamber to process the wafer then, after processing the wafer, moving the arm of the robot into the processing chamber to retrieve the wafer from the specimen holder onto the arm, and transferring the wafer from the processing chamber into the transfer chamber; the vacuum processing method comprising:
   a step of preparing a unit and an adjusting device, the unit detecting an amount of deviation of the wafer on the arm in the vacuum transfer chamber from a reference position, the adjusting device adjusting an operation of the robot based on the detected amount of deviation;
   a step of, after an initial teaching operation that links information from sensors detecting in advance the position of the arm to an actual position of the arm, performing a second teaching operation, the second teaching operation including, before processing the wafer, a step of detecting an amount of wafer position deviation being detected during a wafer transfer operation in each of predetermined plural patterns which include a first pattern of transferring the wafer into or out of the processing chamber using only one of the two arms and a second pattern of transferring the wafer into or out of the processing chamber using the two arms, and a step of adjusting the information from the sensors in the initial teaching operation such that the amounts of wafer position deviations in the first pattern and the second pattern can be matched; and
   a step of adjusting the operation of the robot by the adjusting device according to a result of the second teaching and transferring the wafer for processing.

6. A vacuum processing method according to claim 5, wherein, in the second teaching operation, a reference position of one of the two arms is set in a way that matches the amount of deviation detected during the transfer operation in the first pattern with the amount of deviation detected during the transfer operation in the second pattern.

7. A vacuum processing method according to claim 6, wherein, in the second teaching operation, an average of the amount of the deviation detected during the transfer operation of one or more of the wafers min the first pattern is matched to an average of the deviation amount detected during the transfer operation in the second pattern.

8. A vacuum processing method according to claim 5, based on the information on the position deviation amounts detected by executing a plurality of wafer transfer patterns using a combination of the two arms, the second teaching operation is performed in a way that matches the position deviation amounts detected during some of the plurality of transfer patterns that exceed a predetermined allowable range to the position deviation amounts detected during the other transfer patterns that fall within the predetermined allowable range.

\* \* \* \* \*